United States Patent
Yang

(10) Patent No.: US 9,548,369 B2
(45) Date of Patent: Jan. 17, 2017

(54) MEMORY DEVICE AND METHOD OF MANUFACTURING THE SAME

(71) Applicant: MACRONIX International Co., Ltd., Hsinchu (TW)

(72) Inventor: Zu-Sing Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 6 days.

(21) Appl. No.: 14/670,289

(22) Filed: Mar. 26, 2015

(65) Prior Publication Data
US 2016/0284808 A1    Sep. 29, 2016

(51) Int. Cl.
*H01L 29/423* (2006.01)
*H01L 27/115* (2006.01)

(52) U.S. Cl.
CPC ... *H01L 29/42372* (2013.01); *H01L 27/11582* (2013.01); *H01L 29/42364* (2013.01)

(58) Field of Classification Search
CPC .............................................. H01L 29/42372
See application file for complete search history.

(56) References Cited

U.S. PATENT DOCUMENTS

| 7,338,859 | B2 * | 3/2008 | Park | H01L 21/28273 257/314 |
| 2012/0001249 | A1 * | 1/2012 | Alsmeier | H01L 27/11551 257/319 |
| 2014/0045307 | A1 | 2/2014 | Alsmeier et al. | |
| 2014/0070302 | A1 * | 3/2014 | Yoo | H01L 27/1157 257/324 |
| 2015/0008501 | A1 * | 1/2015 | Sakuma | H01L 21/28273 257/316 |
| 2016/0163725 | A1 * | 6/2016 | Kamiya | H01L 21/0206 257/321 |

FOREIGN PATENT DOCUMENTS

| TW | 201316457 | 4/2013 |
| TW | 201511237 | 3/2015 |

OTHER PUBLICATIONS

"Office Action of Taiwan Counterpart Application", issued on May 10, 2016, p. 1-p. 6, in which the listed references were cited.

* cited by examiner

*Primary Examiner* — Lex Malsawma
(74) *Attorney, Agent, or Firm* — J.C. Patents

(57) ABSTRACT

Provided is a memory device including a substrate, a first stack structure, and a plurality of second stack structures. The substrate has a first region and a second region. The first stack structure is located on the substrate of the first region. The second stack structures are located on the substrate of the second region. A sidewall of the first stack structure and a sidewall of the second stack structure have a concave-and-convex surface respectively.

13 Claims, 3 Drawing Sheets

MEMORY DEVICE AND METHOD OF MANUFACTURING THE SAME

BACKGROUND OF THE INVENTION

Field of the Invention

The invention relates to a semiconductor device and a method of manufacturing the same, and more particularly relates to a memory device and a method of manufacturing the same.

Description of Related Art

With the advancement of technology, it has become a trend to integrate components of the memory cell array region and the peripheral circuit region on the same chip in order to reduce costs, simplify manufacturing steps, and save the chip area. However, due to the increasing aspect ratio of the memory device, the different pattern densities of the memory cell array region and the peripheral circuit region may easily cause the micro-loading effect. The micro-loading effect generally refers to errors of the size of the semiconductor device that occur during the etching process due to the different pattern densities. For example, the peripheral circuit region where the pattern density is lower may easily have a sub-trench defect that poses difficulty for the window of the subsequent processes. Therefore, how to prevent the micro-loading effect between the memory cell array region and the peripheral circuit region and improve the sub-trench defect of the peripheral circuit region is an important issue that needs to be addressed.

SUMMARY OF THE INVENTION

The invention provides a memory device and a method of manufacturing the same for solving a micro-loading effect between a memory cell array region and a peripheral circuit region and improving a sub-trench defect of the peripheral circuit region.

The invention provides a memory device including a substrate, a first stack structure, a plurality of second stack structures, and a bottom dielectric structure. The substrate has a first region and a second region. The first stack structure is located on the substrate of the first region. The first stack structure includes a plurality of first conductor layers and a plurality of first dielectric layers. The first conductor layers and the first dielectric layers are stacked alternately. The second stack structures are located on the substrate of the second region. Each of the second stack structures includes a plurality of second conductor layers and a plurality of second dielectric layers. The second conductor layers and the second dielectric layers are stacked alternately. A sidewall of the first stack structure and a sidewall of the second stack structure have concave-and-convex surfaces respectively.

In an embodiment of the invention, a contour of the sidewall of the first stack structure and a contour of the sidewall of the second stack structure comprise at least two vertical tangent surfaces.

In an embodiment of the invention, each of the first dielectric layers has a first top critical dimension, a first middle critical dimension, and a first bottom critical dimension, wherein the first middle critical dimension is greater than the first top critical dimension, and the first middle critical dimension is greater than the first bottom critical dimension; and each of the first conductor layers has a second top critical dimension, a second middle critical dimension, and a second bottom critical dimension, wherein the second middle critical dimension is smaller than or equal to the second top critical dimension, and the second middle critical dimension is smaller than or equal to the second bottom critical dimension.

In an embodiment of the invention, the first middle critical dimension is greater than the second middle critical dimension.

In an embodiment of the invention, each of the second dielectric layers has a first top critical dimension, a first middle critical dimension, and a first bottom critical dimension, wherein the first middle critical dimension is greater than the first top critical dimension, and the first middle critical dimension is greater than the first bottom critical dimension; and each of the second conductor layers has a second top critical dimension, a second middle critical dimension, and a second bottom critical dimension, wherein the second middle critical dimension is smaller than or equal to the second top critical dimension, and the second middle critical dimension is smaller than or equal to the second bottom critical dimension.

In an embodiment of the invention, the first middle critical dimension is greater than the second middle critical dimension.

In an embodiment of the invention, the memory device further includes a bottom dielectric structure located between the substrate and the first stack structure and between the substrate and the second stack structures. The bottom dielectric structure includes a body part, a first protrusion part, and a plurality of second protrusion parts, wherein the first protrusion part extends from the body part and is located between the body part and the first stack structure, and the second protrusion parts extend from the body part and are respectively located between the body part and the second stack structures. A distance between a top surface of the body part adjacent to the first stack structure and a top surface of the body part away from the first stack structure is smaller than 100 Å.

In an embodiment of the invention, the distance between the top surface of the body part adjacent to the first stack structure and the top surface of the body part away from the first stack structure is in a range of 10 Å to 100 Å.

In an embodiment of the invention, the first region is a peripheral circuit region and the second region is a memory cell array region.

The invention provides a memory device, including: a substrate having a first region and a second region; a first stack structure disposed on the substrate of the first region and including a plurality of first conductor layers and a plurality of first dielectric layers, wherein the first conductor layers and the first dielectric layers are stacked alternately; a plurality of second stack structures disposed on the substrate of the second region and each including a plurality of second conductor layers and a plurality of second dielectric layers, wherein the second conductor layers and the second dielectric layers are stacked alternately; and a bottom dielectric structure disposed between the substrate and the first stack structure and between the substrate and the second stack structures. The bottom dielectric structure includes a body part, a first protrusion part, and a plurality of second protrusion parts. The first protrusion part extends from the body part and is located between the body part and the first stack structure, and the second protrusion parts extend from the body part and are respectively located between the body part and the second stack structures. A distance between a top surface of the first stack structure and a top surface of the body part adjacent to the first stack structure is 1 to 1.1 times a distance between a top surface of the second stack structure and the top surface of the body part adjacent to the second stack structures.

In an embodiment of the invention, a thickness of the first protrusion part is 1 to 2 times a thickness of each second protrusion part.

In an embodiment of the invention, a bottom width of the first stack structure is greater than a bottom width of each of the second stack structures.

In an embodiment of the invention, the memory device further includes a charge storage layer covering a surface of the first stack structure and surfaces of the second stack structures; and a third conductor layer covering a surface of the charge storage layer.

The invention provides a manufacturing method for manufacturing a memory device, which includes the following. A substrate is provided. The substrate has a first region and a second region. A bottom dielectric layer is formed on the substrate. The bottom dielectric layer is across the first region and the second region. A stack layer is formed on the bottom dielectric layer. The stack layer includes a plurality of first conductor layers and a plurality of first dielectric layers. The first conductor layers and the first dielectric layers are stacked alternately. A portion of the stack layer is removed by performing an etching process on the stack layer, so as to form a first stack structure on the substrate of the first region and a plurality of second stack structures on the substrate of the second region. The etching process includes a plurality of first etching steps and a plurality of second etching steps. The first etching steps and the second etching steps are performed alternately.

In an embodiment of the invention, the first etching steps include removing a portion of the first conductor layers, and the second etching steps include removing a portion of the first dielectric layers.

In an embodiment of the invention, the manufacturing method further includes forming a mask layer, which includes an advanced patterning film, a nitride layer, or a combination thereof, on the stack layer before performing the etching process.

In an embodiment of the invention, a material of the advanced patterning film includes a carbonaceous material, which includes amorphous carbon.

In an embodiment of the invention, the manufacturing method further includes the following after performing the etching process: forming a charge storage layer on the first stack structure and the second stack structures; and forming a second conductor layer on the charge storage layer.

In an embodiment of the invention, the manufacturing method further includes removing a portion of the bottom dielectric layer to form a bottom dielectric structure when performing the etching process, wherein the bottom dielectric structure includes a body part, a first protrusion part, and a plurality of second protrusion parts, wherein the first protrusion part extends from the body part and is located between the body part and the first stack structure, and the second protrusion parts extend from the body part and are respectively located between the body part and the second stack structures.

In an embodiment of the invention, the first etching steps and the second etching steps use different reaction gases.

Based on the above, the manufacturing method of the memory device of the invention includes alternately performing the first etching steps and the second etching steps so as to alternately remove the conductor layers and the dielectric layers. Therefore, according to the invention, the stack layer that includes the conductor layers and the dielectric layers is removed sequentially to reduce the microloading effect between the memory cell array region and the peripheral circuit region. Thereby, the invention improves the sub-trench defect of the peripheral circuit region and increases the window of the subsequent manufacturing processes.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
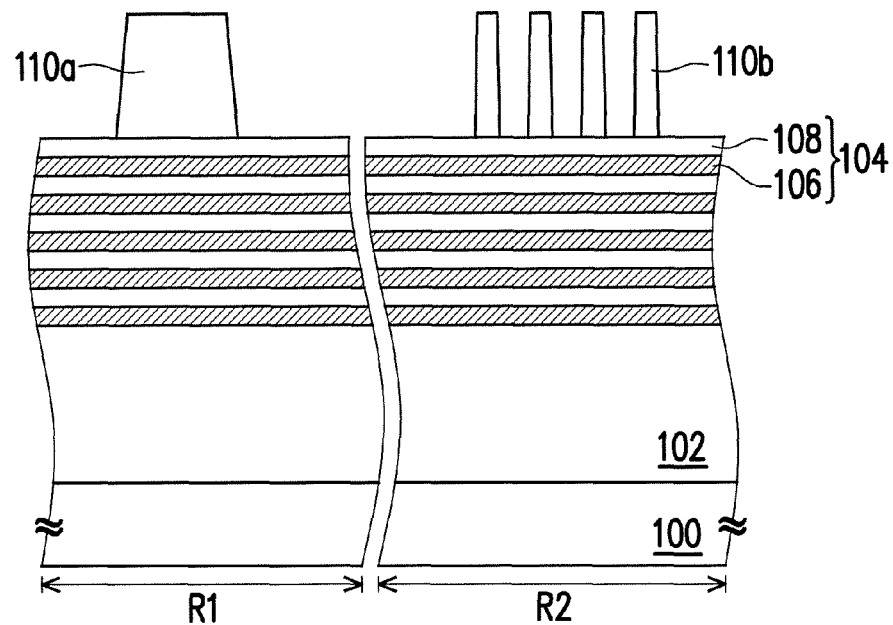
FIG. 1A to FIG. 1C are schematic cross-sectional views showing a manufacturing method of a memory device according to an embodiment of the invention.
Figure 1B:
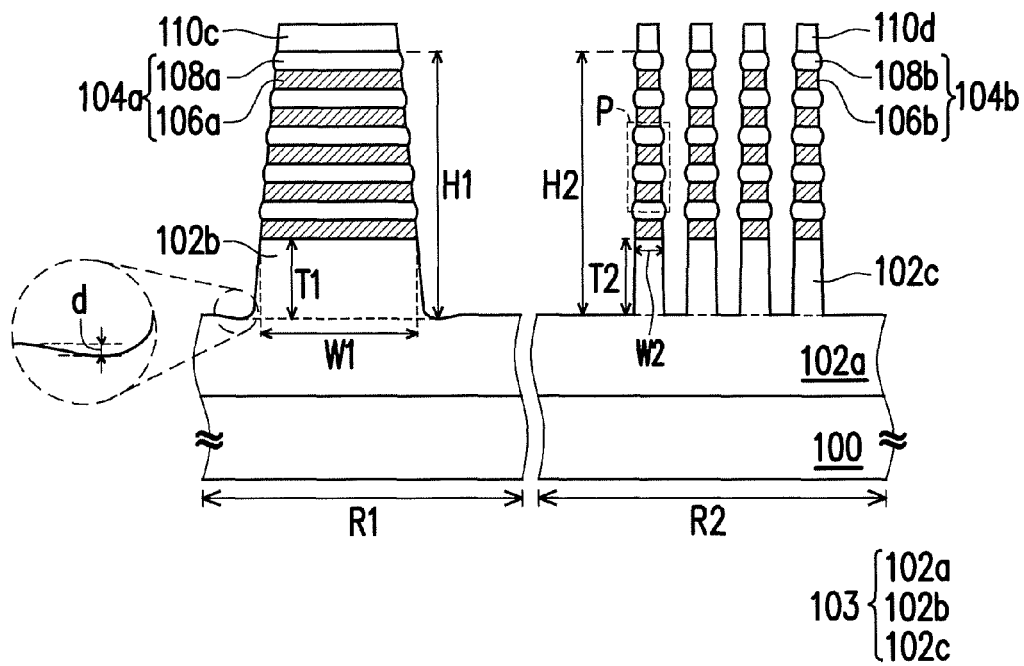
Figure 1C:
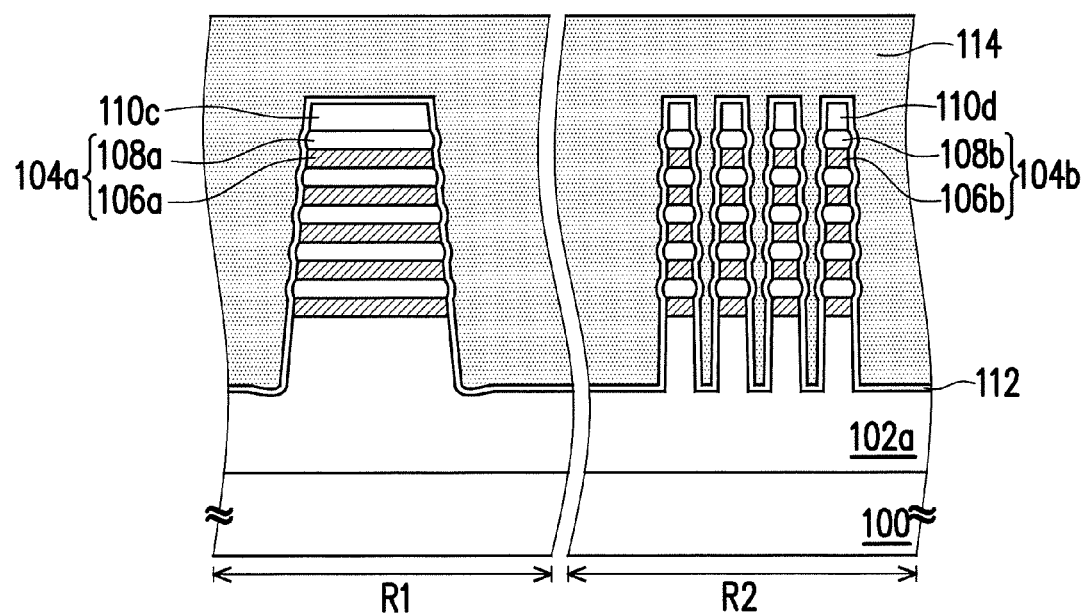

FIG. 1A to FIG. 1C are schematic cross-sectional views showing a manufacturing method of a memory device according to an embodiment of the invention.

With reference to FIG. 1A, first, a substrate 100 is provided. The substrate 100 has a first region R1 and a second region R2. In this embodiment, the first region R1 is a peripheral circuit region and the second region R2 is a memory cell array region, for example. The substrate 100 is a semiconductor substrate, a semiconductor compound substrate, or a semiconductor over insulator (SOI) substrate, for example. The semiconductor is IVA group atoms, such as silicon or germanium, for example. The semiconductor compound is forming of IVA group atoms, such as silicon carbide or silicon germanium, or formed of IIIA group atoms and VA group atoms, such as gallium arsenide, for example.

Then, a bottom dielectric layer 102 is formed on the substrate 100. The bottom dielectric layer 102 is disposed across the first region R1 and the second region R2. A material of the bottom dielectric layer 102 includes a silicon oxide, a silicon nitride, or a combination thereof, and a method of forming the bottom dielectric layer 102 includes performing chemical vapor deposition, for example. A thickness of the bottom dielectric layer 102 is in a range of 200 Å to 5000 Å, for example. In an embodiment, the bottom dielectric layer 102 is a bottom oxide layer (BOX), for example.

Next, a stack layer 104 is formed on the bottom dielectric layer 102. The stack layer 104 includes a plurality of conductor layers 106 and a plurality of dielectric layers 108. The conductor layers 106 and the dielectric layers 108 are stacked alternately. In an embodiment, a material of the conductor layer 106 includes doped polysilicon, undoped polysilicon, or a combination thereof, and a method of forming the conductor layer 106 includes performing chemical vapor deposition, for example. A thickness of the conductor layer 106 is in a range of 200 Å to 1000 Å, for example. A material of the dielectric layer 108 includes a silicon oxide, a silicon nitride, or a combination thereof, and a method of forming the dielectric layer 108 includes performing chemical vapor deposition, for example. A thickness of the dielectric layer 108 is in a range of 200 Å to 1000 Å, for example. Although FIG. 1A shows only five conductor layers 106 and five dielectric layers 108, the invention is not limited thereto. In other embodiments, the number of the conductor layers 106 may be eight, sixteen, thirty two, or more, for example. Likewise, the dielectric layer 108 is disposed between adjacent two conductor layers 106, and therefore the number of the dielectric layers 108 may also be eight, sixteen, thirty two, or more, for example.

Thereafter, patterned mask layers 110a and 110b are formed on the stack layer 104. The patterned mask layers 110a and 110b are advanced patterning films (APFs), nitride layers, or a combination thereof, for example. A material of the advanced patterning film (APF) includes a carbonaceous material, which may be amorphous carbon, for example. In this embodiment, the advanced patterning film (APF) is formed after the nitride layer is formed on the stack layer 104.

With reference to FIG. 1A and FIG. 1B, a portion of the bottom dielectric layer 102 and a portion of the stack layer 104 are removed by performing an etching process on the stack layer 104 with the patterned mask layers 110a and 110b as masks, so as to form a first stack structure 104a, a plurality of second stack structures 104b, and a bottom dielectric structure 103. Because a portion of the patterned mask layers 110a and 110b are consumed during the aforementioned etching process, a patterned mask layer 110c is formed on the first stack structure 104a, and patterned mask layers 110d are formed on the second stack structures 104b simultaneously (as shown in FIG. 1B). In this embodiment, a thickness of each of the patterned mask layers 110c and 110d is in a range of 200 Å to 2000 Å, for example.

The first stack structure 104a is located on the substrate 100 of the first region R1. The first stack structure 104a includes a plurality of conductor layers 106a and a plurality of dielectric layers 108a. The conductor layers 106a and the dielectric layers 108a are stacked alternately. The second stack structures 104b are located on the substrate 100 of the second region R2. Each of the second stack structures 104b includes a plurality of conductor layers 106b and a plurality of dielectric layers 108b. The conductor layers 106b and the dielectric layers 108b are stacked alternately. The bottom dielectric structure 103 is located between the substrate 100 and the first stack structure 104a and between the substrate 100 and the second stack structures 104b. More specifically, the bottom dielectric structure 103 includes a body part 102a, a first protrusion part 102b, and a plurality of second protrusion parts 102c. The first protrusion part 102b extends from the body part 102a and is located between the body part 102a and the first stack structure 104a. The second protrusion parts 102c extend from the body part 102a and are respectively located between the body part 102a and the second stack structures 104b. Details of the structure of the memory device of this embodiment will be provided later hereinafter.

It should be noted that the aforementioned etching process includes a plurality of first etching steps and a plurality of second etching steps. The first etching steps are for removing a portion of the conductor layer 106; and the second etching steps are for removing a portion of the dielectric layer 108. The first etching steps and the second etching steps are performed alternately. More specifically, when a portion of the stack layer 104 is removed, the first etching step, the second etching step, the first etching step, the second etching step, etc. are performed sequentially to remove a portion of the conductor layer 106, a portion of the dielectric layer 108, a portion of the conductor layer 106, a portion of the dielectric layer 108, etc. sequentially. Then, a portion of the bottom dielectric layer 102 is removed by the second etching step, so as to expose sidewalls of the first protrusion part 102b and the second protrusion parts 102c. In an embodiment, different reaction gases are used in the first etching step and the second etching step.

In this embodiment, the aforementioned etching process includes alternately performing the first etching steps and the second etching steps to alternately remove a portion of the conductor layer 106 and a portion of the dielectric layer 108. Since the first etching steps are for removing the conductor layer 106 and the second etching steps are for removing the dielectric layer 108, the portion of the conductor layer 106 and the portion of the dielectric layer 108 that are not covered by the patterned mask layers 110a and 110b can be completely removed in this embodiment. In other words, even though the first region R1 (e.g., the memory cell array region) and the second region R2 (e.g., the peripheral circuit region) have different pattern densities, the stack layer having a high aspect ratio is removed using the aforementioned etching process, so as to reduce the micro-loading effect between the memory cell array region and the peripheral circuit region. Thereby, the invention improves the sub-trench defect of the peripheral circuit region and increases the window of the subsequent manufacturing processes.

In this embodiment, the etching process is dry etching, for example. The dry etching is reactive ion etching (RIE), for example. The first etching step is carried out with HBr at a flow rate of 200 sccm to 400 sccm, $O_2$ at a flow rate of 7.5 sccm to 20 sccm, a pressure of 10 mTorr to 70 mTorr, a source power (Ws) of 400 W to 1200 W, and a bias power (Wb) of 100 W to 800 W, for example. The second etching step is carried out with $CF_4$ at a flow rate of 100 sccm to 300 sccm, $CHF_3$ at a flow rate of 100 sccm to 300 sccm, $CH_2F_2$ at a flow rate of 10 sccm to 300 sccm, $N_2$ at a flow rate of 100 sccm to 500 sccm, $O_2$ at a flow rate of 5 sccm to 20 sccm, a pressure of 10 mTorr to 50 mTorr, a source power (Ws) of 400 W to 1200 W, a bias power (Wb) of 100 W to 800 W, and a plasma frequency of 200 Hz to 1000 Hz, for example.

Next, with reference to FIG. 1C, a charge storage layer 112 is formed on the first stack structure 104a and the second stack structures 104b. The charge storage layer 112 is formed conformally on a surface of the first stack structure 104a and surfaces of the second stack structures 104b. In an embodiment, the charge storage layer 112 is, for example, a composite layer composed of Oxide-Nitride-Oxide (ONO). The composite layer may include three layers or more. However, it should be noted that the invention is not limited thereto. A forming method of the charge storage layer 112 may include performing chemical vapor deposition and thermal oxidation.

Thereafter, a conductor layer 114 is formed on the charge storage layer 112. In an embodiment, the conductor layer 114 in the second region R2 (e.g., the memory cell array region) is a word line (WL), and the second stack structures 104b are bit lines (BL), for example. Nevertheless, the invention is not limited thereto. In other embodiments, the second stack structure 104b is the word line and the conductor layer 114 is the bit line, for example. A material of the conductor layer 114 is doped polysilicon, undoped polysilicon, or a combination thereof, for example. A forming method of the conductor layer 114 may include performing chemical vapor deposition. A thickness of the conductor layer 114 is in a range of 200 Å to 3000 Å, for example.

Figure 2A:
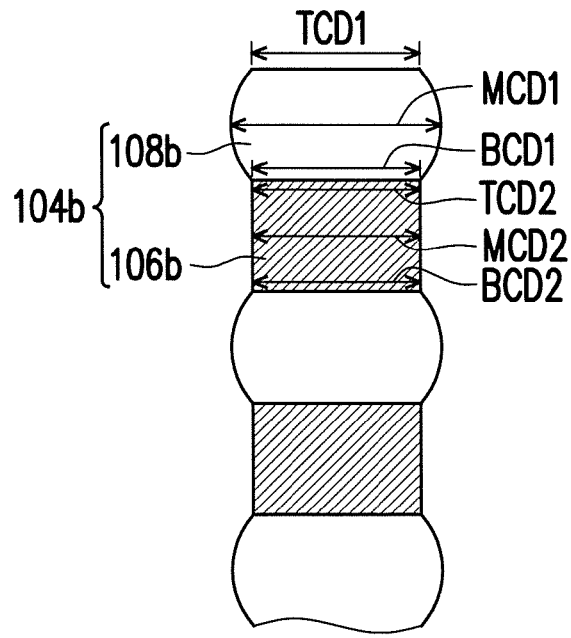
FIG. 2A to FIG. 2B are schematic enlarged views respectively showing a portion P of a stack structure of FIG. 1B.
Figure 2B:
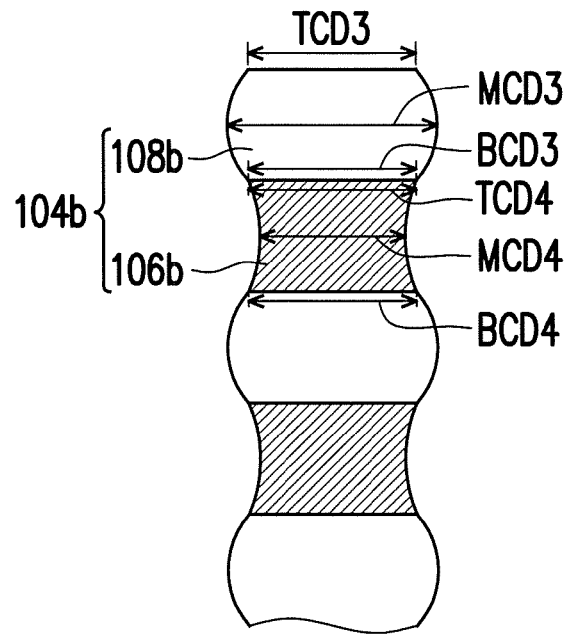

FIG. 2A to FIG. 2B are schematic enlarged views respectively showing a portion P of the stack structure of FIG. 1B.

With reference to FIG. 1B, FIG. 2A, and FIG. 2B, the invention provides a memory device including a substrate 100, a first stack structure 104a, a plurality of second stack structures 104b, and a bottom dielectric structure 102. The substrate 100 has a first region R1 and a second region R2. In this embodiment, the first region R1 is a peripheral circuit region and the second region R2 is a memory cell array region, for example. The first stack structure 104a is located on the substrate 100 of the first region R1. The second stack structures 104b are located on the substrate 100 of the second region R2. The bottom dielectric structure 102 is located between the substrate 100 and the first stack structure 104a and between the substrate 100 and the second stack structures 104b. More specifically, the bottom dielectric structure 103 includes a body part 102a, a first protrusion part 102b, and a plurality of second protrusion parts 102c. The first protrusion part 102b extends from the body part 102a and is located between the body part 102a and the first stack structure 104a. The second protrusion parts 102c extend from the body part 102a and are respectively located between the body part 102a and the second stack structures 104b. In this embodiment, a distance d between a top surface of the body part 102a adjacent to the first stack structure 104a and a top surface of the body part 102a away from the first stack structure 104a is smaller than 100 Å. The distance d is in a range of 10 Å to 100 Å, for example. In comparison with the sub-trench defect of the conventional technology, the top surface of the body part 102a adjacent to the first stack structure 104a in the first region R1 (e.g., the peripheral circuit region) of the invention is less recessed, which increases the window of the subsequent manufacturing processes.

In an embodiment, the first region R1 is the peripheral circuit region and the second region R2 is the memory cell array region, for example. A bottom width W1 of the first stack structure 104a in the first region R1 is greater than a bottom width W2 of the second stack structure 104b in the second region R2. In this embodiment, the bottom width W1 of the first stack structure 104a is 10 to 500 times the bottom width W2 of the second stack structure 104b, for example.

It should be noted that the aforementioned etching process includes alternately performing the first etching steps and the second etching steps so as to alternately remove a portion of the conductor layer 106 and a portion of the dielectric layer 108. From a macroscopic view, a contour of the sidewall of the first stack structure 104a and a contour of the sidewall of the second stack structure 104b can be viewed as two vertical tangent surfaces. On the other hands, due to different etching recipes of the first etching steps and the second etching steps, thus, a contour of the sidewall of the first stack structure 104a and a contour of the sidewall of the second stack structure 104b have a concave and convex surface respectively from a microscopic view. In other words, a contour of the sidewall of the first stack structure 104a and a contour of the sidewall of the second stack structure 104b respectively have a Zig-Zag shape, a dumbbell shape, a corrugated shape, or a combination thereof, for example.

Specifically, taking the second stack structure 104b as an example, as shown in FIG. 2A, the dielectric layer 108b of the second stack structure 104b has a first top critical dimension TCD1, a first middle critical dimension MCD1, and a first bottom critical dimension BCD1. The dielectric layer 108b has an egg shape, for example. Therefore, the first middle critical dimension MCD1 is greater than the first top critical dimension TCD1, and the first middle critical dimension MCD1 is greater than the first bottom critical dimension BCD1. In an embodiment, the sidewall of the dielectric layer 108b is curved. However, the invention is not limited thereto. In other embodiments, the sidewall of the dielectric layer 108b may be angular. Moreover, the conductor layer 106b has a second top critical dimension TCD2, a second middle critical dimension MCD2, and a second bottom critical dimension BCD2. The conductor layer 106b is rectangular, for example. Therefore, the second middle critical dimension MCD2 is equal to the second top critical dimension TCD2, and the second middle critical dimension MCD2 is equal to the second bottom critical dimension BCD2. As shown in FIG. 2A, the first middle critical dimension MCD1 is greater than the second middle critical dimension MCD2. Therefore, the contour of the sidewall of the second stack structure 104b has a dumbbell shape. In an embodiment, the first middle critical dimension MCD1 is in a range of 10 nm to 100 nm, and the second middle critical dimension MCD2 is in a range of 10 nm to 100 nm, for example.

In another embodiment, as shown in FIG. 2B, the dielectric layer 108b of the second stack structure 104b has a third top critical dimension TCD3, a third middle critical dimension MCD3, and a third bottom critical dimension BCD3. The dielectric layer 108b has an egg shape, for example. Therefore, the third middle critical dimension MCD3 is greater than the third top critical dimension TCD3, and the third middle critical dimension MCD3 is greater than the third bottom critical dimension BCD3. Likewise, in an embodiment, the sidewall of the dielectric layer 108b is curved. However, the invention is not limited thereto. In other embodiments, the sidewall of the dielectric layer 108b may be angular. In addition, the conductor layer 106b has a fourth top critical dimension TCD4, a fourth middle critical dimension MCD4, and a fourth bottom critical dimension BCD4. The conductor layer 106b has an hourglass shape, for example. Therefore, the fourth middle critical dimension MCD4 is smaller than the fourth top critical dimension TCD4, and the fourth middle critical dimension MCD4 is smaller than the fourth bottom critical dimension BCD4. As shown in FIG. 2B, the third middle critical dimension MCD3 is greater than the fourth middle critical dimension MCD4. Therefore, the contour of the sidewall of the second stack structure 104b has a corrugated shape. In an embodiment, the third middle critical dimension MCD3 is in a range of 10 nm to 100 nm, and the fourth middle critical dimension MCD4 is in a range of 10 nm to 100 nm, for example. Moreover, in this embodiment, the contour of the sidewall of the first stack structure 104a is similar to the contour of the sidewall of the second stack structure 104b. Thus, details thereof are not repeated hereinafter.

Reverting to FIG. 1B, in this embodiment, a distance H1 between the top surface of the first stack structure 104a and the top surface of the body part 102a adjacent to the first stack structure 104a is in a range of 5000 Å to 20000 Å, and a distance H2 between the top surface of the second stack structure 104b and the top surface of the body part 102a adjacent to the second stack structure 104b is in a range of 5000 Å to 20000 Å, for example. The distance H1 is 1 to 1.1 times the distance H2, for example. Furthermore, a thickness T1 of the first protrusion part 102b is in a range of 2000 Å to 5000 Å, and a thickness T2 of the second protrusion part 102c is in a range of 2000 Å to 5000 Å, for example. The thickness T1 of the first protrusion part 102b is 1 to 2 times the thickness T2 of the second protrusion part 102c, for example.

In conclusion, the manufacturing method of the memory device of the invention includes alternately performing the first etching steps and the second etching steps, so as to alternately remove the conductor layers and the dielectric layers. Therefore, according to the invention, the stack layer that includes the conductor layers and the dielectric layers is sequentially removed to reduce the micro-loading effect between the memory cell array region and the peripheral circuit region. In an embodiment, the distance between the top surface of the body part adjacent to the first stack structure of the memory device and the top surface of the body part away from the first stack structure is smaller than 100 Å. Additionally, in an embodiment, the distance between the top surface of the first stack structure of the memory device and the top surface of the body part adjacent to the first stack structure is 1 to 1.1 times the distance between the top surface of the second stack structure and the top surface of the body part adjacent to the second stack structure. Thereby, the invention improves the sub-trench defect of the peripheral circuit region and increases the window of the subsequent manufacturing processes.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. A memory device, comprising:
   a substrate comprising a first region and a second region;
   a first stack structure disposed on the substrate of the first region and comprising a plurality of first conductor layers and a plurality of first dielectric layers, wherein the first conductor layers and the first dielectric layers are stacked alternately;
   a plurality of second stack structures disposed on the substrate of the second region and each comprising a plurality of second conductor layers and a plurality of second dielectric layers, wherein the second conductor layers and the second dielectric layers are stacked alternately; and
   a bottom dielectric structure disposed between the substrate and the first stack structure and between the substrate and the second stack structures, wherein the bottom dielectric structure comprises a body part, a first protrusion part, and a plurality of second protrusion parts, wherein the first protrusion part extends from the body part and is located between the body part and the first stack structure, and the second protrusion parts extend from the body part and are respectively located between the body part and the second stack structures,
   wherein a sidewall of the first stack structure and a sidewall of the second stack structure have a concave-and-convex surface respectively.

2. The memory device according to claim 1, wherein a contour of the sidewall of the first stack structure and a contour of the sidewall of the second stack structure comprise at least two vertical tangent surfaces.

3. The memory device according to claim 1, wherein:
   each of the first dielectric layers has a first top critical dimension, a first middle critical dimension, and a first bottom critical dimension, wherein the first middle critical dimension is greater than the first top critical dimension, and the first middle critical dimension is greater than the first bottom critical dimension; and
   each of the first conductor layers has a second top critical dimension, a second middle critical dimension, and a second bottom critical dimension, wherein the second middle critical dimension is smaller than or equal to the second top critical dimension, and the second middle critical dimension is smaller than or equal to the second bottom critical dimension.

4. The memory device according to claim 3, wherein the first middle critical dimension is greater than the second middle critical dimension.

5. The memory device according to claim 1, wherein:
   each of the second dielectric layers has a first top critical dimension, a first middle critical dimension, and a first bottom critical dimension, wherein the first middle critical dimension is greater than the first top critical dimension, and the first middle critical dimension is greater than the first bottom critical dimension; and
   each of the second conductor layers has a second top critical dimension, a second middle critical dimension, and a second bottom critical dimension, wherein the second middle critical dimension is smaller than or equal to the second top critical dimension, and the second middle critical dimension is smaller than or equal to the second bottom critical dimension.

6. The memory device according to claim 5, wherein the first middle critical dimension is greater than the second middle critical dimension.

7. The memory device according to claim 1, wherein a distance between a top surface of the body part adjacent to the first stack structure and a top surface of the body part away from the first stack structure is smaller than 100 Å.

8. The memory device according to claim 7, wherein the distance between the top surface of the body part adjacent to the first stack structure and the top surface of the body part away from the first stack structure is in a range of 10 Å to 100 Å.

9. The memory device according to claim 1, wherein the first region is a peripheral circuit region and the second region is a memory cell array region.

10. A memory device, comprising:
    a substrate comprising a first region and a second region;
    a first stack structure disposed on the substrate of the first region and comprising a plurality of first conductor layers and a plurality of first dielectric layers, wherein the first conductor layers and the first dielectric layers are stacked alternately;
    a plurality of second stack structures disposed on the substrate of the second region and each comprising a plurality of second conductor layers and a plurality of second dielectric layers, wherein the second conductor layers and the second dielectric layers are stacked alternately; and
    a bottom dielectric structure disposed between the substrate and the first stack structure and between the substrate and the second stack structures, wherein the bottom dielectric structure comprises a body part, a first protrusion part, and a plurality of second protrusion parts, wherein the first protrusion part extends from the body part and is located between the body part and the first stack structure, and the second protrusion parts extend from the body part and are respectively located between the body part and the second stack structures,
    wherein a distance between a top surface of the first stack structure and a top surface of the body part adjacent to the first stack structure is 1 to 1.1 times a distance between a top surface of the second stack structure and the top surface of the body part adjacent to the second stack structures.

11. The memory device according to claim 10, wherein a thickness of the first protrusion part is 1 to 2 times a thickness of each second protrusion part.

12. The memory device according to claim 10, wherein a bottom width of the first stack structure is greater than a bottom width of each of the second stack structures.

13. The memory device according to claim 10, further comprising:
- a charge storage layer covering a surface of the first stack structure and surfaces of the second stack structures; and
- a third conductor layer covering a surface of the charge storage layer.

* * * * *